United States Patent
Ra

(10) Patent No.: US 11,482,158 B2
(45) Date of Patent: Oct. 25, 2022

(54) DISPLAY DRIVER IC AND DISPLAY DEVICE INCLUDING THE SAME

(71) Applicant: Samsung Electronics Co., Ltd., Suwon-si (KR)

(72) Inventor: Joong Min Ra, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 66 days.

(21) Appl. No.: 17/152,192

(22) Filed: Jan. 19, 2021

(65) Prior Publication Data
US 2021/0366360 A1  Nov. 25, 2021

(30) Foreign Application Priority Data

May 25, 2020  (KR) .................. 10-2020-0062415

(51) Int. Cl.
*G09G 3/20* (2006.01)
*G09G 5/00* (2006.01)
(Continued)

(52) U.S. Cl.
CPC .......... *G09G 3/2096* (2013.01); *G06F 3/0412* (2013.01); *G06F 3/0416* (2013.01);
(Continued)

(58) Field of Classification Search
CPC ....... G09G 2310/0275; G09G 2310/08; G09G 2310/027; G09G 2310/0267; G09G 2310/0297; G09G 2370/08; G09G 2360/04; G09G 2360/127; G09G 2360/128; G09G 2360/18; G09G 5/006; G09G 5/18; G09G 5/397; G09G 3/3648; G09G 3/2096; G09G 3/06; G09G 3/0601; G09G 2370/00; G09G 3/20; G09G 3/2092; G09G 3/3688; G09G 5/395; G09G 5/003; G09G 2360/12;
(Continued)

(56) References Cited

U.S. PATENT DOCUMENTS 5,689,473 A   11/1997 Toda
6,825,845 B2  11/2004 Nally
(Continued)

FOREIGN PATENT DOCUMENTS

JP    4183556 B2    11/2008
KR    101476515 B1   12/2014

*Primary Examiner* — Dismery Mercedes
(74) *Attorney, Agent, or Firm* — Muir Patent Law, PLLC

(57) ABSTRACT

A display driver integrated circuit (IC) includes a logic module sequentially issuing read commands including a first read command, a second read command succeeding the first read command, and a third read command succeeding the second read command, and memory modules connected in series with each other. A first memory module is connected to the logic module and is the closest memory module to the logic module. The first memory module receives the read commands, provide the first read command to a first memory of the first memory module, read first image data from the first memory in response to the first read command, and provide the first image data and first remaining read commands among the read commands to a second memory module which is connected to the first memory module and farther than the first memory module from the logic module.

9 Claims, 17 Drawing Sheets

(51) Int. Cl.
    *G06F 13/00*      (2006.01)
    *G06F 13/16*      (2006.01)
    *G06F 3/06*       (2006.01)
    *G06F 3/041*      (2006.01)
    *G11C 11/4063*    (2006.01)
    *G11C 11/4076*    (2006.01)
(52) U.S. Cl.
    CPC ........ *G06F 3/0656* (2013.01); *G06F 13/1657*
        (2013.01); *G09G 5/003* (2013.01); *G11C*
        *11/4063* (2013.01); *G11C 11/4076* (2013.01);
        *G09G 2310/0264* (2013.01); *G09G 2310/0267*
        (2013.01); *G09G 2310/0275* (2013.01); *G09G*
        *2310/08* (2013.01); *G09G 2360/12* (2013.01);
        *G09G 2360/18* (2013.01)
(58) Field of Classification Search
    CPC .... G09G 2310/0264; G09G 2310/0927; G06F
        12/0207; G06F 13/16; G06F 13/1673;
        G06F 13/28; G06F 3/0412; G06F 3/14;
        G06F 3/0416; G06F 3/1446; G06F
        15/7839; G06F 15/7864; G06F 15/786;
        G06F 15/0283; G06F 11/1072; G06F
        3/0653; G06F 3/0656; G06F 13/00; G06F
        11/1666; G06F 11/1657; G06F 11/1668;
        G11C 8/16; G11C 8/18; G11C 8/06;
        G11C 7/222; G11C 7/1051; G11C 7/106;
        G11C 7/1006; G11C 7/22; G11C 7/1045;
        G11C 7/1015; G11C 7/103; G11C 7/10;
        G11C 11/4063; G11C 11/4076
    See application file for complete search history.

(56) References Cited

U.S. PATENT DOCUMENTS

| | | | | |
|---|---|---|---|---|
| 7,979,616 | B2 * | 7/2011 | Bravo | G06F 13/1684 |
| | | | | 710/60 |
| 8,212,797 | B2 | 7/2012 | Inokawa | |
| 8,612,712 | B2 | 12/2013 | Larson | |
| 8,843,806 | B2 * | 9/2014 | Meaney | G06F 11/10 |
| | | | | 714/770 |
| 9,659,515 | B2 * | 5/2017 | Cho | G09G 3/2092 |
| 9,753,651 | B2 * | 9/2017 | Choi | G06F 3/0659 |
| 9,953,686 | B2 * | 4/2018 | Matsui | G11C 11/4093 |
| 10,269,284 | B2 * | 4/2019 | Jung | G09G 3/3688 |
| 10,593,266 | B2 * | 3/2020 | Cheon | G09G 5/003 |
| 10,939,557 | B2 * | 3/2021 | Choi | H05K 1/148 |
| 2012/0120057 | A1 * | 5/2012 | Cho | H04N 13/398 |
| | | | | 345/204 |
| 2014/0049525 | A1 * | 2/2014 | Lin | G09G 3/02 |
| | | | | 345/204 |
| 2014/0198021 | A1 * | 7/2014 | Tu | G09G 3/3688 |
| | | | | 345/87 |
| 2014/0237177 | A1 * | 8/2014 | Yu | G11C 11/40607 |
| | | | | 711/106 |
| 2018/0039107 | A1 * | 2/2018 | Sasaki | G09G 3/3607 |

\* cited by examiner

DISPLAY DRIVER IC AND DISPLAY DEVICE INCLUDING THE SAME

This application claims the benefit of Korean Patent Application No. 10-2020-0062415, filed on May 25, 2020, in the Korean Intellectual Property Office, the disclosure of which is incorporated by reference herein in its entirety.

BACKGROUND

1. Field

The present disclosure relates to a display driver integrated circuit (IC) and a display device including the same, and more particularly, to a display driver IC including a memory module.

2. Description of the Related Art

Display devices used in electronic devices that display images, such as televisions, laptop computers, monitors and mobile devices, include liquid crystal display (LCDs) or organic light emitting diodes (OLEDs). A display device may include a display panel having a plurality of pixels and a display drive integrated circuit (IC) for transmitting electrical signals to the pixels. An image may be realized by the electrical signals provided from the display drive IC (i.e., a display driver IC) to the pixels. Mobile display drive ICs are desirable to be more lightweight and smaller for application to mobile phones and the like.

A mobile display drive IC is not square but has a rectangular structure with a long side. Therefore, a memory disposed in the mobile display drive IC has a problem in that a distance over which a signal is transmitted is long. In addition, whenever factors such as product processes and product sizes are changed, the memory must be re-designed in consideration of various factors.

SUMMARY

Aspects of the present disclosure provide a display drive integrated circuit (IC) including a memory module with reduced bandwidth loss.

Aspects of the present disclosure also provide a display drive IC which can reduce the time required to design a memory module.

Aspects of the present disclosure also provide a display device including a display drive IC which includes a memory module with reduced bandwidth loss.

Aspects of the present disclosure also provide a display device including a display drive IC which can reduce the time required to design a memory module.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present invention, a display driver integrated circuit (IC) includes a logic module sequentially issuing a plurality of read commands including a first read command, a second read command succeeding the first read command, and a third read command succeeding the second read command, and a plurality of memory modules connected in series with each other. A first memory module is connected to the logic module and is the closest memory module to the logic module. The first memory module receives the plurality of read commands, provide the first read command to a first memory of the first memory module, read first image data from the first memory in response to the first read command, and provide the first image data and a plurality of first remaining read commands among the plurality of read commands to a second memory module which is connected to the first memory module and farther than the first memory module from the logic module.

According to an exemplary embodiment of the present invention, a display drive IC includes a logic module configured to sequentially issue a plurality of read commands for a first channel, the plurality of read commands including a first read command, a second read command succeeding the first read command, and a third read command succeeding the second read command, a plurality of first-channel memory modules connected in series with each other in the first channel and including a first memory module, a second memory module and a third memory module, the first memory module being disposed on a first side of the logic module and connected thereto, the first memory module being the closest memory module among the plurality of first-channel memory modules to the logic module, and a termination module which is connected to the last memory module among the plurality of first-channel memory modules, the last memory module being the farthest one among the plurality of first-channel memory modules from the logic module. The first memory module includes a first decoder, a first memory, a first transmitter, a first downstream latch, and a first upstream latch. The first decoder receives the plurality of read commands, provides the first read command to the first memory of the first memory module, and provides a plurality of first remaining read commands among the plurality of read commands via the first downstream latch to the second memory module which is connected to the first memory module and is farther than the first memory module from the logic module. The first memory outputs first image data in response to the first read command and provides the first image data to the first transmitter. The first transmitter provides the first image data to the termination module. The first upstream latch of the first memory receives the first image data from the termination module and provides the first image data to the logic module.

According to an exemplary embodiment of the present invention, a display device includes a display panel which includes a pixel, a gate line which is electrically connected to the pixel, a gate driver configured to provide a gate voltage signal to the pixel through the gate line, a source line which is electrically connected to the pixel, a source driver providing a driving current to the pixel through the source line, and a display drive controller providing a control signal to the source driver and the gate driver. The display drive controller includes a logic module issuing a control signal including a first signal and a second signal succeeding the first signal, a termination module, and a first memory module, a second memory module and a third memory module which are configured to store first image data, second image data, and third image data, respectively, for driving the gate driver and the source driver and are sequentially connected to each other. The first memory module is connected to the logic module, the third memory module is connected to the termination module, and the second memory module is disposed between the first memory module and the third memory module. Each of the first memory module, the second memory module and the third memory module includes a decoder, a memory, and a transmitter. A decoder of the first memory module provides the first signal to a memory of the first memory module and provides the second signal to a decoder of the second memory module without providing the second signal to the memory of the first memory module. The second memory module accesses the memory of the second memory module in response to the second signal which corresponds to a read command. The memory of the second memory module provides the second image data to a transmitter of the third memory module through a transmitter of the second memory module. The transmitter of the third memory module provides the second image data to the termination module. The termination module provides the second image data to the logic module sequentially through the third memory module, the second memory module and the first memory module.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the technical spirit of the present disclosure will be described with reference to the accompanying drawings.

An electronic device 1 including a display device will now be described with reference to FIGS. 1 through 3.

Figure 1:
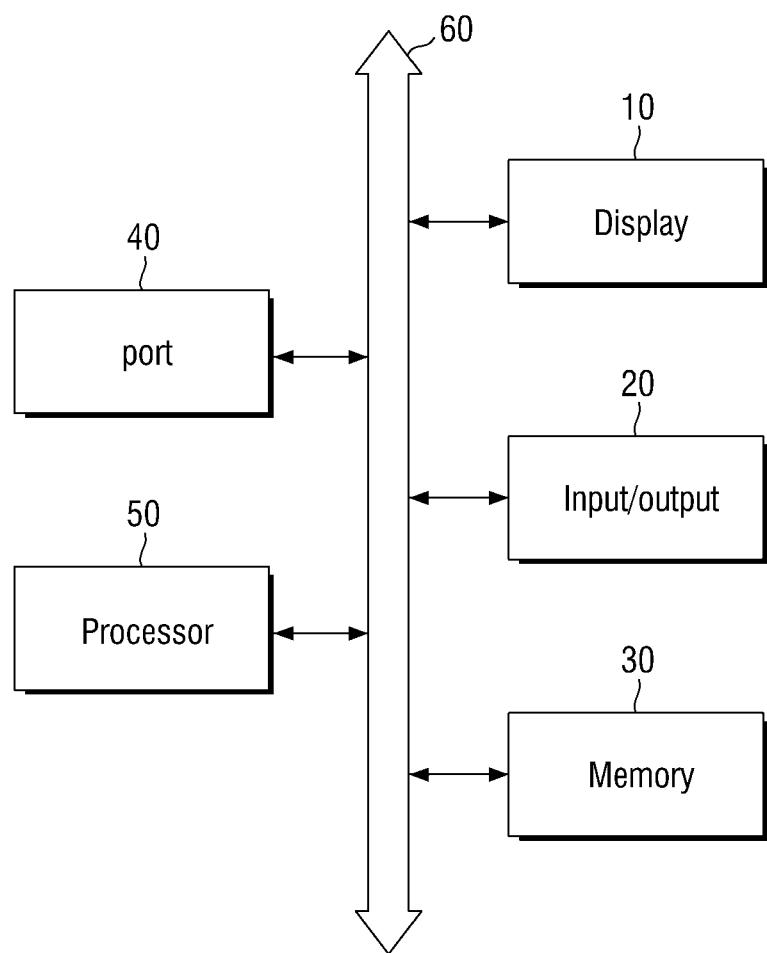
FIG. 1 is a block diagram of an electronic device 1 including a display device according to embodiments of the present disclosure.

FIG. 1 is a block diagram of an electronic device 1 including a display device according to embodiments of the present disclosure. FIGS. 2 and 3 are block diagrams of a display device including a display drive integrated circuit (IC) according to embodiments of the present disclosure.

Referring to FIG. 1, the electronic device 1 according to the embodiments may include a display device 10, an input/output unit 20, a memory 30, a port 40, and a processor 50. The electronic device 1 may include televisions, desktop computers, or mobile devices such as smartphones, tablet personal computers (PCs) and laptop computers. The display device 10, the input/output unit 20, the memory 30, the port 40, and the processor 50 may communicate with each other through a bus 60.

The display device 10 may include a display driver and a display panel. In some embodiments, the display driver may display image data, which is transmitted by the processor 50 (e.g., an application processor (AP)) through the bus 60 according to an operation mode, on the display panel. The display driver may generate a number of gamma voltages corresponding to the number of bits of the image data transmitted by the processor 50, select at least some of the gamma voltages according to the image data, and input the selected gamma voltages to unit buffers.

In some embodiments, two or more gamma voltages having different magnitudes may be input to input ports of the unit buffers that output gray voltages in a predetermined range.

Figure 2:
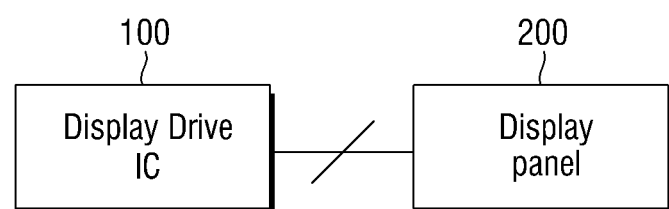
FIGS. 2 and 3 are block diagrams of a display device including a display drive integrated circuit (IC) according to embodiments of the present disclosure.
Figure 3:
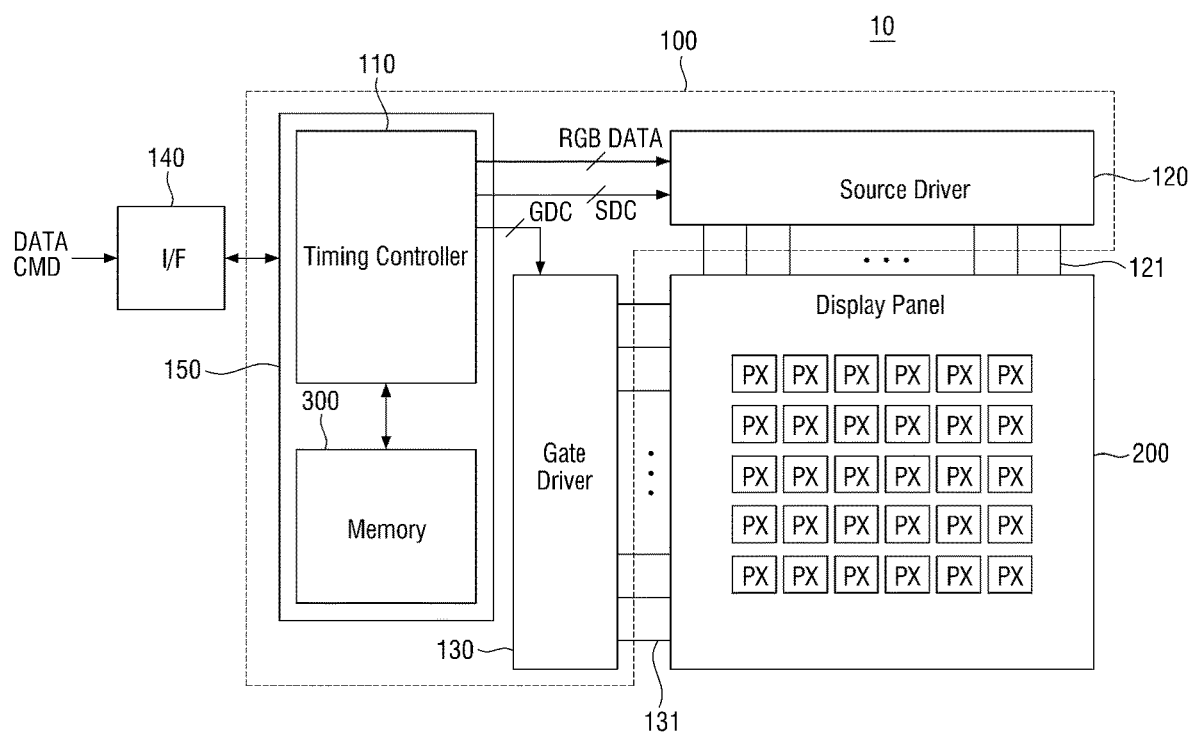

Referring to FIGS. 2 and 3, the display device 10 according to the embodiments of the present disclosure may include a display drive IC 100 (i.e., a display driver IC) and a display panel 200.

Referring to FIG. 2, the display drive IC 100 may control the display panel 200.

The display device 10 according to the embodiments of the present disclosure may be any one of various display devices such as an organic light emitting diode display (OLED), a liquid crystal display (LCD), an electrochromic display (ECD), a digital mirror device (DMD), an actuated mirror device (AMD), a grating light value (GLV), a plasma display panel (PDP), and an electroluminescent display (ELD).

Referring to FIG. 3, the display drive IC 100 may include a display drive controller 150 (i.e., a display driver controller), a source driver 120, and a gate driver 130.

The display drive controller 150 may receive data DATA and a command CMD from the outside, for example, from a host (e.g., the processor 50) of a system having the display device 10 and provide image data RGB DATA, a source driver control signal SDC and a gate driver control signal GDC required for operation to the source driver 120 and the gate driver 130. The memory 300 may be, for example, a frame memory. The display drive controller 150 may further include an image processing unit, a memory controller, a command pre-buffer, a command register, and a command sync controller.

The display panel 200 may include a plurality of gate lines 131 which deliver scan signals in a row direction, a plurality of source lines 121 which are disposed in a direction intersecting the gate lines 131 and deliver data signals in a column direction, and a plurality of pixels PX which are arranged at intersections of the gate lines 131 and the source lines 121.

When the gate lines 131 are sequentially selected, gray voltages may be applied to the pixels PX connected to the selected gate lines 131 through the source lines 121.

Each of the pixels PX may include a switching transistor, a driving transistor, a storage capacitor, and an organic light emitting diode. The gate lines 131 and the source lines 121 may be connected to the pixels PX.

The source driver 120 may convert the image data RGB DATA which is digital data received from the display drive controller 150 into gray voltages and apply the gray voltages to the display panel 200 through the source lines 121. The gate driver 130 may sequentially scan the gate lines 131. The gate driver 130 may activate a selected gate line 131 by applying a gate-on voltage to the selected gate line 131, and the source driver 120 may output corresponding gray voltages to pixels PX connected to the activated gate line 131. Accordingly, the display panel 200 may display an image on a horizontal line-by-horizontal line basis, that is, on a row-by-row basis.

The display device 10 may communicate with the host (e.g., the processor 50) through an interface circuit 140. The interface circuit 140 receives the data DATA and the command CMD transmitted in parallel or in series from the host and provides the data DATA and the command CMD to the display drive controller 150. The data DATA and the command CMD may be transmitted from the host (e.g., the processor 50) of the system having the display device 10. The interface circuit 140 may receive the data DATA and the command CMD according to an interface method corresponding to a transmission method of the host. For example, the interface method used by the interface circuit 140 may be one of an RGB interface, a central processing unit (CPU) interface, a service provider interface (PSI), a mobile display digital interface (MDDI), and a mobile industry processor interface (MIPI).

The display drive controller 150 may include a timing controller 110 and a memory 300.

The timing controller 110 may generate the source driver control signal SDC for controlling the operation timing of the source driver 120 and the gate driver control signal GDC for controlling the operation timing of the gate driver 130 based on signals such as the data DATA and the command CMD.

The memory 300 may temporarily store one frame of the image data RGB DATA to be displayed on the display panel 200 and output the one frame of the image data RGB DATA so that the image data RGB DATA is displayed on the display panel 200. The memory 300 is also called a graphic random access memory (GRAM), and a volatile memory such as a static random access memory (SRAM) may be used. However, embodiments according to the technical spirit of the present disclosure are not limited thereto, and various types of memories may be used.

The display drive controller 150 may control the overall operation of the memory 300, in particular, control the addresses and timings at which a write operation and a read operation are performed in the memory 300.

The operation of a display drive IC 100 including memory modules 400 and the operation of the memory modules 400 will now be described with reference to FIGS. 4 through 9.

Figure 4:
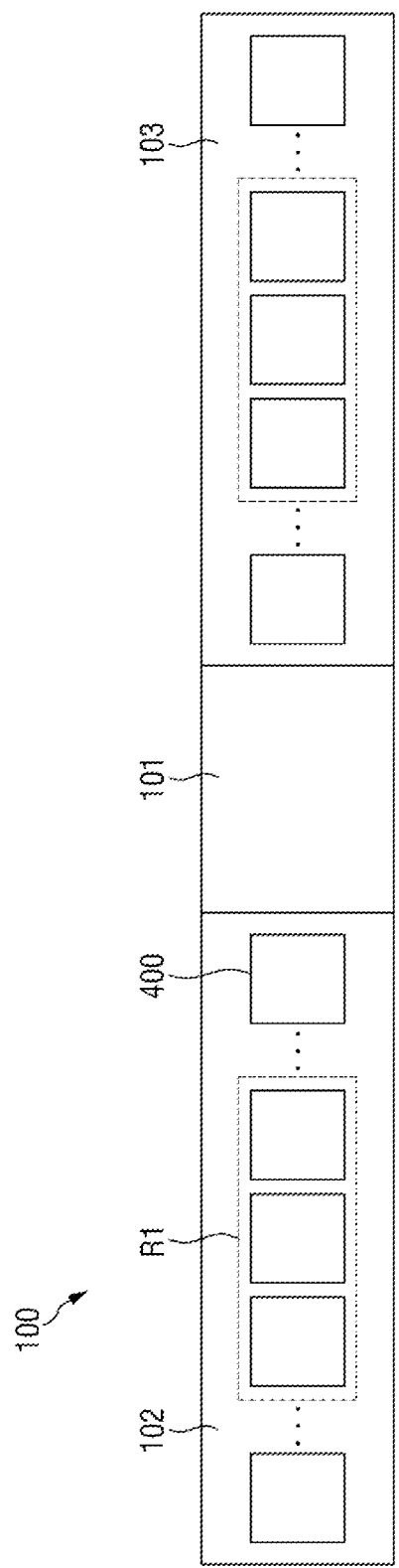
FIG. 4 illustrates a display drive IC according to embodiments of the present disclosure.
Figure 5:
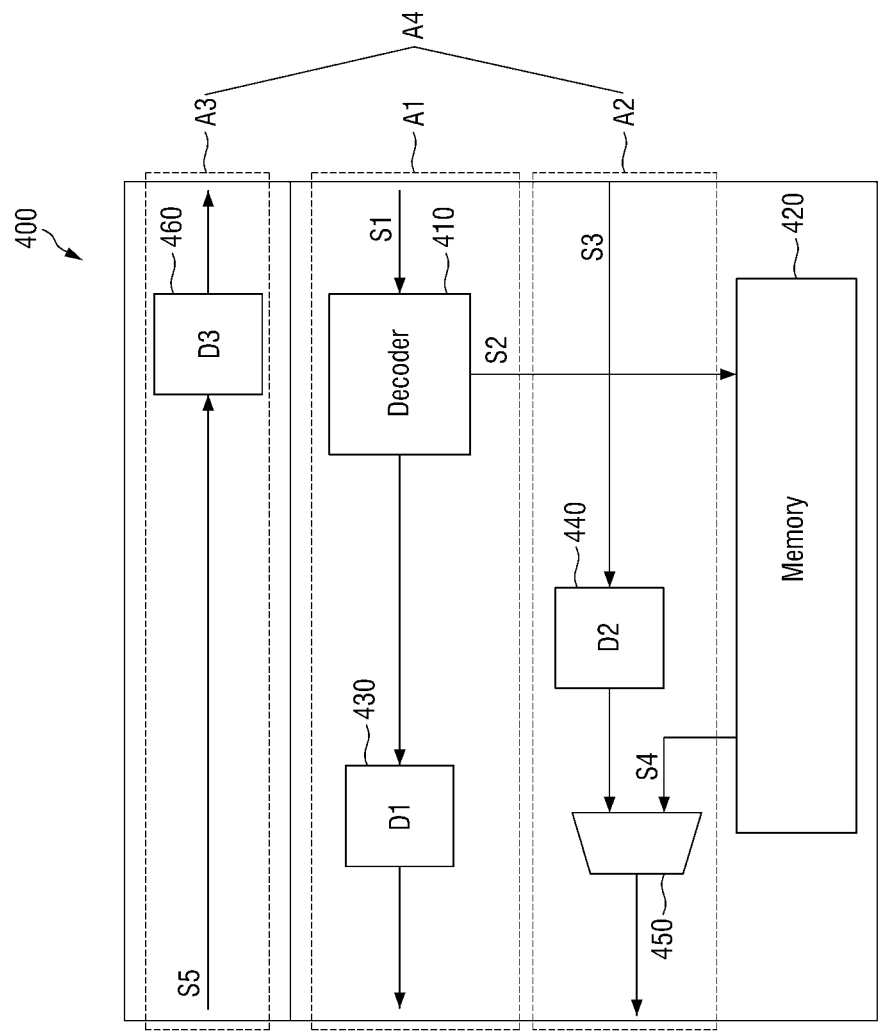
FIG. 5 illustrates a memory module of FIG. 4.
Figure 6:
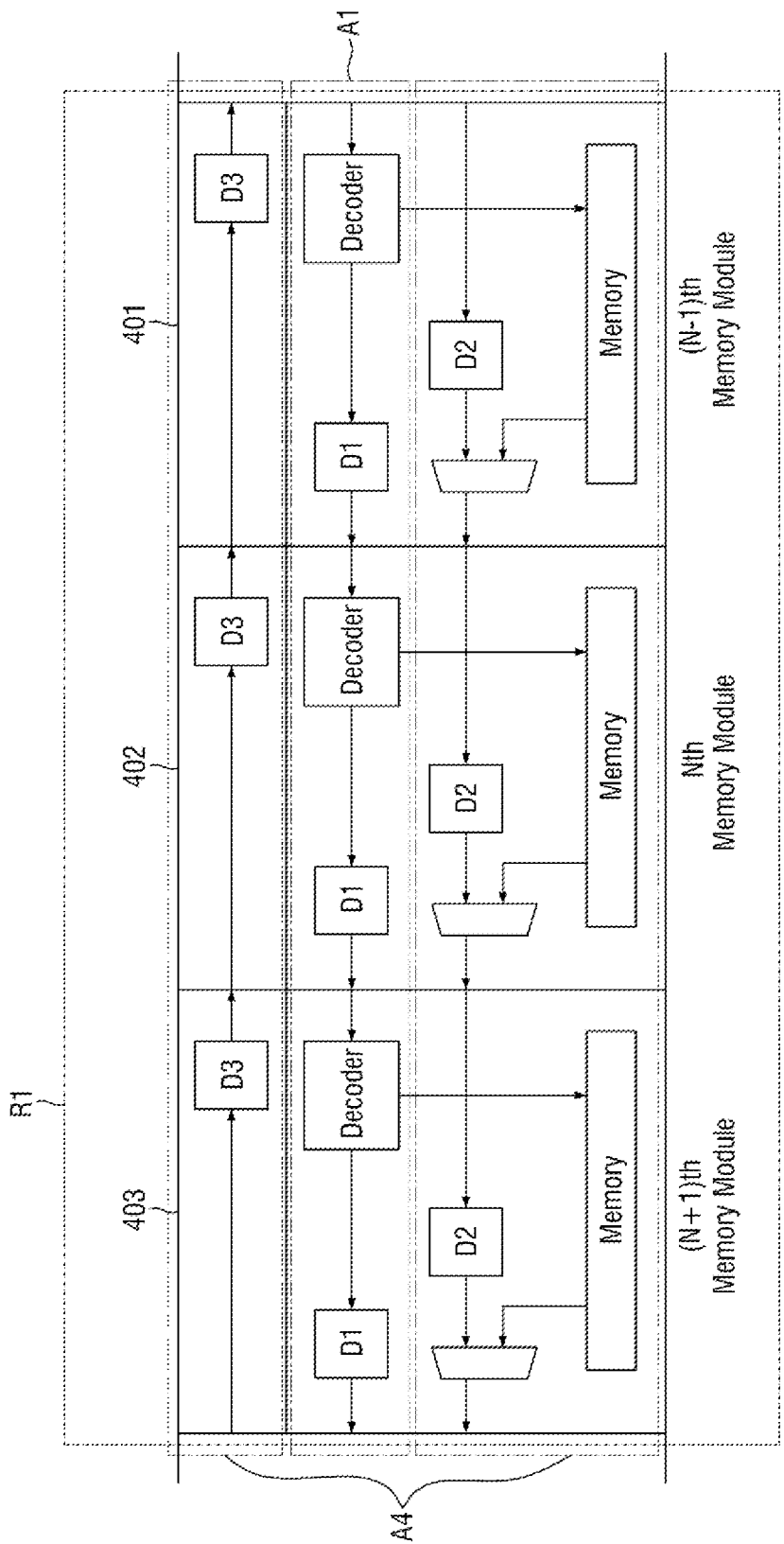
FIG. 6 is an enlarged view of region R1 of FIG. 4.
Figure 7:
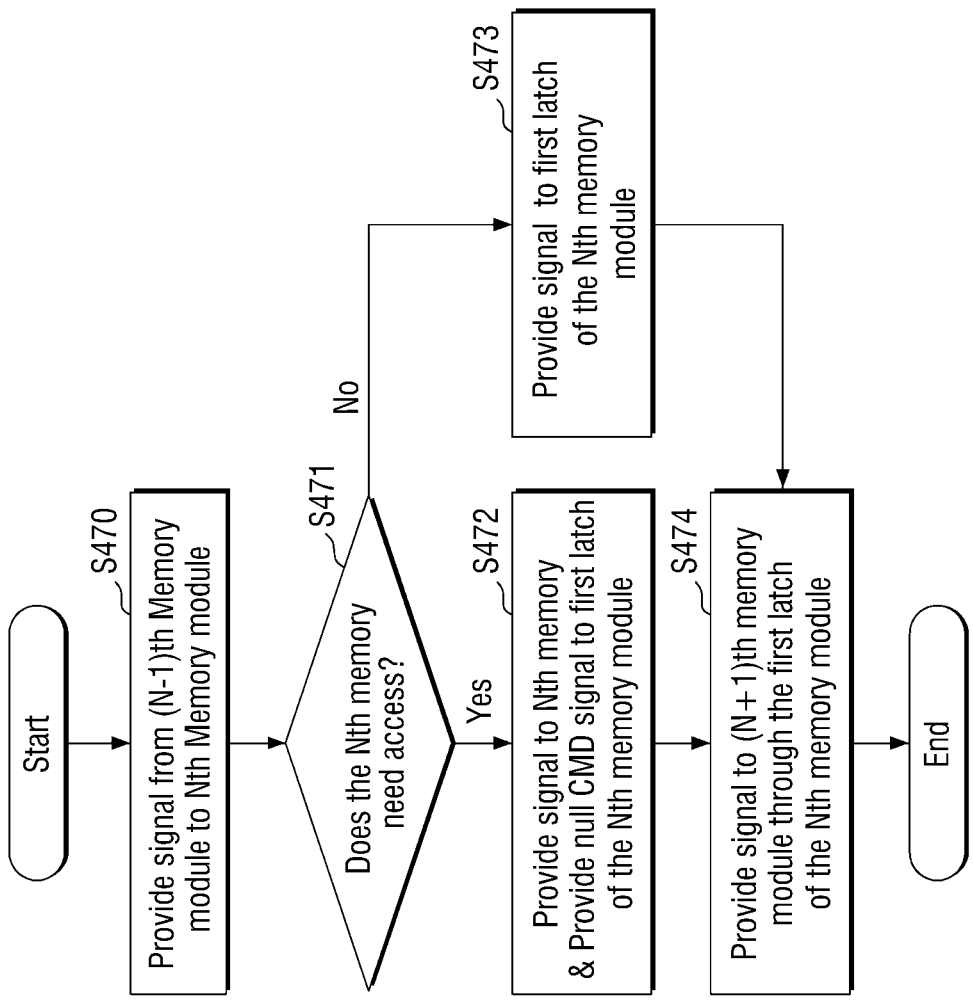
FIGS. 7 through 9 are flowcharts illustrating a method of operating the display drive IC according to embodiments of the present disclosure.
Figure 8:
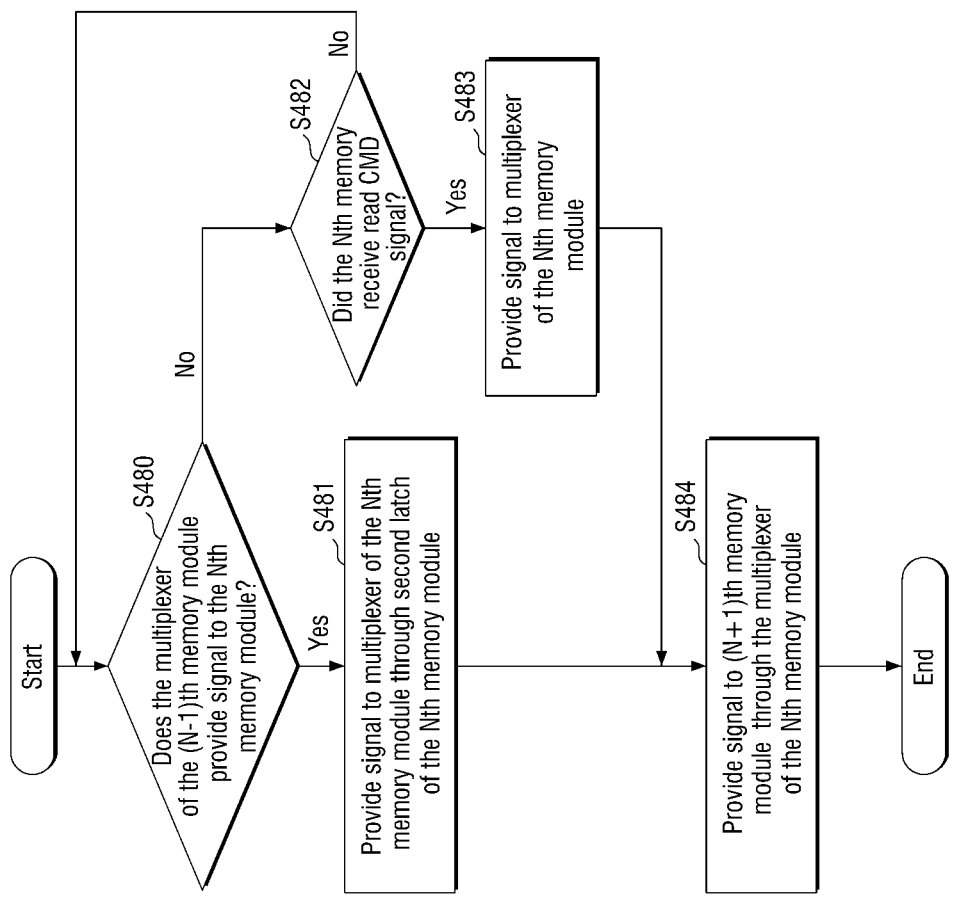
Figure 9:
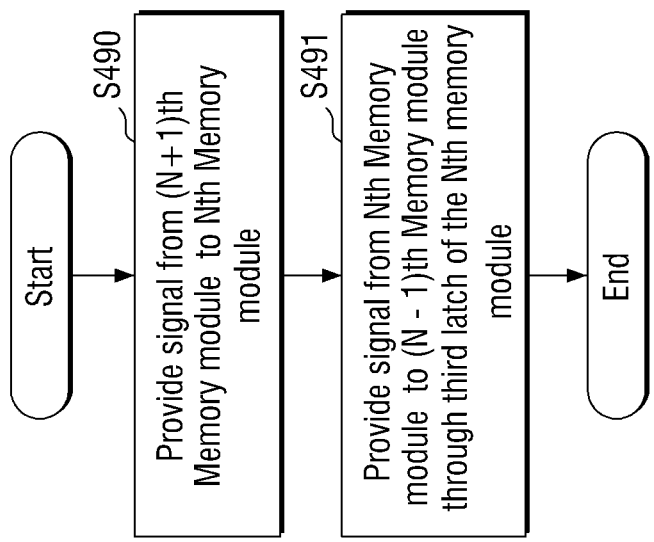

FIG. 4 illustrates a display drive IC according to embodiments of the present disclosure. FIG. 5 illustrates a memory module of FIG. 4. FIG. 6 is an enlarged view of region R1 of FIG. 4. FIGS. 7 through 9 are flowcharts illustrating a method of operating the display drive IC according to embodiments of the present disclosure.

Referring to FIG. 4, the display drive IC 100 may include a logic region 101, a first region 102, and a second region 103. As illustrated in the drawing, the display drive IC 100 may be a rectangular shape in which one side is longer than another side. However, embodiments according to the technical spirit of the present disclosure are not limited thereto, and the display drive IC 100 may have other shapes.

The rectangular first region 102 may be disposed on a side of the logic region 101, and the rectangular second region 103 may be disposed on the other side of the logic region 101 which is opposite the side on which the first region 102 is disposed. The logic region 101 may be disposed between the first region 102 and the second region 103.

A logic module may be disposed in the logic region 101. In addition, the logic module may include, for example, a timing controller 110 of the display drive IC 100. The logic module may control a source driver 120 and a gate driver 130 and may control the overall operation of the memory 300. In an example embodiment, the display drive IC 100 may have a dual-channel memory architecture having a first channel and a second channel.

A plurality of memory modules 400 may include a plurality of first-channel memory modules which are for the first channel and are disposed in the first region 102, and a plurality of second-channel memory modules which are for the second channel and are disposed in the second region 103. The memory 300 of the display drive IC 100 may include the memory modules 400 or may be the same as the memory modules 400. The memory modules 400 may be disposed in series along long sides of the first region 102 and the second region 103. The memory modules 400 may be connected in series to each other. For example, the memory modules 400 may be disposed in series and may be connected to each other. A memory module 400 among the memory modules 400 disposed closest to the logic region 101 may be connected to the logic module of the logic region 101. The logic module of the logic region 101 may control the overall operation of the memory modules 400. For example, the logic module may control the addresses and timings to perform write or read operations on the memory modules 400.

Referring to FIG. 5, a memory module 400 may include a decoder 410, a memory 420, a first latch 430, a second latch 440, a transmitter 450, and a third latch 460. The memory modules 400 of FIG. 4 may have the same structure as the memory module 400 of FIG. 5. However, embodiments according to the technical spirit of the present disclosure are not limited thereto, and a specific element may be omitted.

The decoder 410 may be connected to the memory 420 and the first latch 430. The decoder 410 may receive a first signal S1 from a previous memory module 400. In addition, when the decoder 410 is connected to the logic module, it may receive the first signal S1 from the logic module. The decoder 410 may provide a second signal S2 to the memory 420. The second signal S2 may include image data and a command in the case of a write operation and may include a command in the case of a read operation.

The memory 420 may be connected to the decoder 410 and the transmitter 450. The memory 420 may include a GRAM. In addition, the memory 420 may include an SRAM. However, embodiments according to the technical spirit of the present disclosure are not limited thereto, and the memory 420 may also include a volatile memory such as a dynamic RAM (DRAM) or a synchronous dynamic RAM (SDRAM). The memory 420 may receive the second signal S2 from the decoder 410 and perform a read operation or a write operation. After the read operation or the write operation, the memory 420 may provide a fourth signal S4 including an access result to the transmitter 450.

Each of the first latch 430, the second latch 440, and the third latch 460 may include a D flip-flop. However, embodiments according to the technical spirit of the present disclosure are not limited thereto.

The second latch 440 may receive a third signal S3 from the previous memory module 400. The second latch 440 may receive the third signal S3 and store data. The second latch 440 may output the data and provide the data to the transmitter 450. When the memory module 400 is connected to the logic module, the third signal S3 is not provided to the second latch 440.

The transmitter 450 may be connected to the memory 420 and the second latch 440. The transmitter 450 may include a multiplexer (MUX). The transmitter 450 may receive the third signal S3 output from the second latch 440 and the fourth signal S4 output from the memory 420. The transmitter 450 may output the third signal S3 and the fourth signal S4 at different times through control. The transmitter 450 may provide a signal to a next memory module 400.

The first latch 430 may be connected to the decoder 410. The first latch 430 may receive a signal from the decoder 410 and store data. The first latch 430 may output the data and provide a signal to the next memory module 400.

The third latch 460 may receive a fifth signal S5 from another memory module 400 and store data. The third latch 460 may output the data and provide a signal to another memory module 400.

The operation of the memory module 400 may include a first operation A1, a second operation A2, and a third operation A3. The first operation A1 may be performed by the decoder 410 and the first latch 430. The second operation A2 may be performed by the memory 420, the second latch 440, and the transmitter 450. The third operation A3 may be performed by the third latch 460. In an example embodiment, the first operation A1 includes propagating a signal from the logic module along the plurality of first-channel memory modules. For example, the signal of the logic module may travel away from the logic module along a downstream latch and a decoder of each of the plurality of first-channel memory modules. In a read operation, the signal may include a plurality of read commands, each of the plurality of read commands being delivered to a memory of a corresponding memory module and the remaining read commands being provided to the next memory module by a decoder of each first-channel memory module, for example. The second operation A2 and the third operation A3 may include providing an image data read from a corresponding first-channel memory module to the logic module. For example, the second operation A2 may include delivering the read image data to a termination module, which will be later described with reference to FIG. 12, and the third operation may include returning the read image data from the termination module to the logic module. The travelling directions in the second operation A2 and the third operation A3 may be opposite to each other. The second operation A2 and the third operation A3 may be collectively referred to as a fourth operation A4.

In some embodiments, when the operation of the memory module 400 is a read operation, the operation may include the first operation A1 for providing a plurality of read commands to the plurality of memory modules 400 and the fourth operation A4 for receiving image data read from the plurality of the plurality of memory modules 400.

The first operation A1 may include an operation of receiving the first signal S1 from the previous memory module 400 or the logic module. The first operation A1 may further include an operation of providing the second signal S2 to the memory 420 or an operation of providing the second signal S2 to the next memory module 400 through the first latch D1. The second signal S2 may include image data and a write command in the case of a write operation and may include a read command in the case of a read operation.

The fourth operation A4 may include the second operation A2 and the third operation A3. The fourth operation A4 may include transmitting the fourth signal S4 including data read from the memory 420 of the memory module 400 to a termination module 505 (see FIG. 12) to be described later and transmitting the fifth signal S5 substantially the same as the fourth signal S4 from the termination module 505 (see FIG. 12) to the third latch 460 of the memory module 400. In addition, the fourth operation A4 may include transmitting the third signal S3 received from the previous memory module 400 to the termination module 505 (see FIG. 12) and transmitting the fifth signal S5 substantially the same as the third signal S3 from the termination module 505 (see FIG. 12) to the third latch 460 of the memory module 400. The fifth signal S5 may include the third signal S3 and the fourth signal S4. For example, in a read operation, the fourth signal S4 may correspond to data read from the memory module 400, and the third signal S3 may correspond to data provided from the previous memory module to the memory module 400. In an example embodiment, the transmitter 450 may sequentially output the third signal S3 and the fourth signal S5 to form the fifth signal S5. In the fifth signal S5, the third signal S3 may precede the fourth signal S4.

In some embodiments, the first operation A1 and the fourth operation A4 may be separate operations. For example, when the first operation A1 is performed, the fourth operation A4 is not performed. When the fourth operation A4 is performed, the first operation A1 is not performed. The first operation A1 and the fourth operation A4 may be separate operations in terms of timing. However, embodiments according to the technical spirit of the present disclosure are not limited thereto, and the first operation A1 and the fourth operation A4 may be performed together.

Referring to FIG. 6, an $(N-1)^{th}$ memory module 401, an $N^{th}$ memory module 402, and an $(N+1)^{th}$ memory module 403 may be arranged in the region R1 of FIG. 4. Here, N may be a natural number of 2 or greater. Although three or more memory modules 400 are disposed in the first region 102 in the drawing, embodiments according to the technical spirit of the present disclosure are not limited thereto, and only one memory module or two memory modules may be disposed.

The $(N-1)^{th}$ memory module 401, the $N^{th}$ memory module 402, and the $(N+1)^{th}$ memory module 403 may have the same structure as the memory module 400 of FIG. 5. Each of the $(N-1)^{th}$ memory module 401, the $N^{th}$ memory module 402, and the $(N+1)^{th}$ memory module 403 may include a decoder 410, a memory 420, a first latch 430 (i.e., a downstream latch), a second latch 440, a transmitter 450, and a third latch 460 (i.e., an upstream latch). For the simplicity of drawings, those reference numbers are omitted in FIG. 6.

The transmitter 450 of the $(N-1)^{th}$ memory module 401 may be connected to the second latch 440 of the $N^{th}$ memory module 402. The first latch 430 of the $(N-1)^{th}$ memory module 401 may be connected to the decoder 410 of the $N^{th}$ memory module 402. The third latch 460 of the $(N-1)^{th}$ memory module 401 may be connected to the third latch 460 of the $N^{th}$ memory module 402.

The transmitter 450 of the $N^{th}$ memory module 402 may be connected to the second latch 440 of the $(N+1)^{th}$ memory module 403. The first latch 430 of the $N^{th}$ memory module 402 may be connected to the decoder 410 of the $(N+1)^{th}$ memory module 403. The third latch 460 of the $N^{th}$ memory module 402 may be connected to the third latch 460 of the $(N+1)^{th}$ memory module 403.

In some embodiments, the first operation A1 of each of the $(N-1)^{th}$ memory module 401, the $N^{th}$ memory module 402, and the $(N+1)^{th}$ memory module 403 may include an operation of receiving a signal from a previous memory module or the logic module and providing the signal to the memory 420 or an operation of providing a signal to a next memory module through the first latch 430.

In some embodiments, the fourth operation A4 of each of the $(N-1)^{th}$ memory module 401, the $N^{th}$ memory module 402, and the $(N+1)^{th}$ memory module 403 may include an operation of transmitting a signal including data read from the memory 420 to the termination module through the next memory module (e.g., the $(N-1)^{th}$ memory module 401, the $N^{th}$ memory module 402, or the $(N+1)^{th}$ memory module 403) and transmitting the signal from the termination module to the logic module through the memory module (e.g., the $(N-1)^{th}$ memory module 401, the $N^{th}$ memory module 402, or the $(N+1)^{th}$ memory module 403). In addition, the fourth operation A4 may include an operation of transmitting a signal received from the previous memory module (e.g., the $(N-1)^{th}$ memory module 401, the $N^{th}$ memory module 402, or the $(N+1)^{th}$ memory module 403) to the termination module and transmitting the signal from the termination module to the logic module through the memory module (e.g., the $(N-1)^{th}$ memory module 401, the $N^{th}$ memory module 402, or the $(N+1)^{th}$ memory module 403).

In some embodiments, the first operation A1 and the fourth operation A4 of each of the $(N-1)^{th}$ memory module 401, the $N^{th}$ memory module 402, and the $(N+1)^{th}$ memory module 403 may be separate operations. In other words, the first operation A1 and the fourth operation A4 may be separate operations in terms of timing. However, embodiments according to the technical spirit of the present disclosure are not limited thereto, and the first operation A1 and the fourth operation A4 may be performed together.

The first operation A1 in the method of operating the display drive IC 100 will now be described with reference to FIG. 7.

A signal may be provided from the $(N-1)^{th}$ memory module 401 to the $N^{th}$ memory module 402 (operation S470). A signal passing through the decoder 410 and the first latch 430 of the $(N-1)^{th}$ memory module 401 is provided to the decoder 410 of the $N^{th}$ memory module 402. The signal provided to the decoder 410 of the $N^{th}$ memory module 402 may include a command and image data for the memory 420 of the $N^{th}$ memory module 402.

The decoder 410 of the $N^{th}$ memory module 402 may determine whether to access the memory 420 of the $N^{th}$ memory module 402 based on the signal received from the $(N-1)^{th}$ memory module 401 (operation S471).

For example, when the signal received from the $(N-1)^{th}$ memory module 401 requires access to the memory 420 of the $N^{th}$ memory module 402 (operation S471—YES), the decoder 410 of the $N^{th}$ memory module 402 may provide the signal to the memory 420 of the $N^{th}$ memory module 402. In addition, the decoder 410 of the $N^{th}$ memory module 402 may transmit a signal not including a command, that is, a signal including null data to the first latch 430 of the $N^{th}$ memory module 402 (operation S472). The signal including the null data and transmitted to the first latch 430 does not operate the next memory module (e.g., the $(N+1)^{th}$ memory module 403) connected to the memory module (e.g., the $N^{th}$ memory module 402).

When the signal received from the $(N-1)^{th}$ memory module 401 does not require access to the memory 420 of the $N^{th}$ memory module 402 (operation S471—NO), the decoder 410 of the $N^{th}$ memory module 402 may provide the signal to the first latch 430 of the $N^{th}$ memory module 402 (operation S473). Here, the signal received from the $(N-1)^{th}$ memory module 401 is not transmitted to the memory 420 of the $N^{th}$ memory module 402, and the memory 420 of the $N^{th}$ memory module 402 is not accessed. The first latch 430 of the $N^{th}$ memory module 402 may store data of the signal received from the $(N-1)^{th}$ memory module 401.

The first latch 430 of the $N^{th}$ memory module 402 may output the stored data and provide the data to the $(N+1)^{th}$ memory module 403 (operation S474). In the process of the data being stored in and output from the first latch 430 of the $N^{th}$ memory module 402, the signal may be delayed by 1 clock cycle. The decoder 410 of the $(N+1)^{th}$ memory module 403 may receive the delayed signal.

When access to the memory 420 of a memory module 400 is not required, the operation of another memory module 400 does not occur in a cycle after the memory module 400. Therefore, the power consumption of the display drive IC 100 may be prevented.

The second operation A2 in the method of operating the display drive IC 100 will now be described with reference to FIG. 8.

The logic module may determine whether a signal is provided from the transmitter 450 of the $(N-1)^{th}$ memory module 401 to the $N^{th}$ memory module 402 (operation S480). The signal provided from the transmitter 450 of the $(N-1)^{th}$ memory module 401 may be a signal provided from the memory 420 of the $(N-1)^{th}$ memory module 401 or the second latch 440 of the $(N-1)^{th}$ memory module 401.

When a signal is provided from the transmitter 450 of the $(N-1)^{th}$ memory module 401 to the $N^{th}$ memory module 402 (operation S480—YES), the signal may be provided to the transmitter 450 (e.g., a multiplexer) of the $N^{th}$ memory module 402 through the second latch 440 of the $N^{th}$ memory module 402 (operation S481). The signal may be stored in the second latch 440 of the $N^{th}$ memory module 402, delayed by 1 clock cycle, and then output to the transmitter 450 of the $N^{th}$ memory module 402.

When a signal is not provided from the transmitter 450 of the $(N-1)^{th}$ memory module 401 to the $N^{th}$ memory module 402 (operation S480—NO), for example, when the $N^{th}$ memory module 402 is connected to the logic module or when the memory 420 of the $(N-1)^{th}$ memory module 401 is not accessed, it may be determined whether the memory 420 of the $N^{th}$ memory module 402 has received a read command signal (operation S482). It may be determined whether the decoder 410 of the $N^{th}$ memory module 402 has received a signal including read command data and provided the signal to the memory 420 of the $N^{th}$ memory module 402.

When the memory 420 of the $N^{th}$ memory module 402 has received the read command signal (operation S482—YES), a signal including image data may be output from the memory 420 of the $N^{th}$ memory module 402 and then provided to the transmitter 450 (e.g., a multiplexer) of the $N^{th}$ memory module 402 (operation S483).

When the memory 420 of the $N^{th}$ memory module 402 has not received the read command signal (operation S482—NO), the logic module may determine again whether a signal is provided from the transmitter 450 of the $(N-1)^{th}$ memory module 401 to the $N^{th}$ memory module 402 (operation S480).

The signal provided from the second latch 440 of the $N^{th}$ memory module 402 to the transmitter 450 of the $N^{th}$ memory module 402 or the signal provided from the memory 420 of the $N^{th}$ memory module 402 to the transmitter 450 of the $N^{th}$ memory module 403 may be provided to the $(N+1)^{th}$ memory module 403 through the transmitter 450 (operation S484). The transmitter 450 may selectively transmit the signal and may sequentially arrange and transmit the signal delayed by 1 clock cycle and provided from the $(N-1)^{th}$ memory module 401 and the signal output from the memory 420 of the N$^{th}$ memory module 402. For example, the signal may be transmitted to the transmitter 450 of the (N+1)$^{th}$ memory module 403 through the second latch 440 of the (N+1)$^{th}$ memory module 403.

The third operation A3 in the method of operating the display drive IC 100 will now be described with reference to FIG. 9.

A signal may be provided from the (N+1)$^{th}$ memory module 403 to the N$^{th}$ memory module 402 (operation S490). For example, a signal output from the transmitter 450 of the (N+1)$^{th}$ memory module 403 may be provided back to the (N+1)$^{th}$ memory module 403. A signal output from the transmitter 450 of the (N+1)$^{th}$ memory module 403 may be transmitted to the third latch 460 of the (N+1)$^{th}$ memory module 403. The third latch 460 of the (N+1)$^{th}$ memory module 403 may store data of the signal and output a signal delayed by 1 clock cycle. The signal output from the third latch 460 of the (N+1)$^{th}$ memory module 403 may be transmitted to the third latch 460 of the N$^{th}$ memory module 402. The third latch 460 of the N$^{th}$ memory module 402 may store data of the signal and output a signal delayed by 1 clock cycle.

A signal may be provided from the N$^{th}$ memory module 402 to the (N−1)$^{th}$ memory module 401 (operation S491). For example, a signal output from the third latch 460 of the N$^{th}$ memory module 402 may be transmitted to the third latch 460 of the (N−1)$^{th}$ memory module 401. The third latch 460 of the (N−1)$^{th}$ memory module 401 may store data of the signal and output a signal delayed by 1 clock cycle. The signal output from the third latch 460 of the (N−1)$^{th}$ memory module 401 may be transmitted to, for example, the logic module.

Since whether the memory 420 has been accessed is determined through the decoder 410 of each memory module 400, power consumption may be reduced. In addition, since a signal provided through the first latch 430 of each memory module 400 is delayed, the memory modules 400 may be used sequentially. Also, signals received through the second latch 440 and the transmitter 450 may be delayed and sequentially arranged and transmitted.

The memory modules 400 have the same structure, for example, include the decoder 410, the memory 420, the first latch 430, the second latch 440, the transmitter 450, and the third latch 460. Therefore, the memory modules 400 may be connected in cascade (or in series) with each other from the logic module. In addition, a signal provided from the logic module may be transmitted sequentially through the memory modules 400, and an access result of the memory 420 may be output to the logic module through the memory modules 400.

Therefore, it is possible to store and output a large bandwidth of data by using a number of memories and reduce random access constraints. For example, when four memory modules 400 are used and when the memory 420 of one memory module 400 stores 2 Mb, the memory 300 may store 8 Mb when the four memory modules 400 are connected. In addition, the time and cost required to design the memory 300 using the identical memory modules 400 may be reduced. For example, when a memory capacity larger than the memory capacity of the previously used memory 300 is required, the previously designed memory modules 400 may be connected in series and used.

The operation of the display drive IC 100 when a memory of a memory module is read will now be described with reference to FIGS. 10 and 11.

Figure 10:
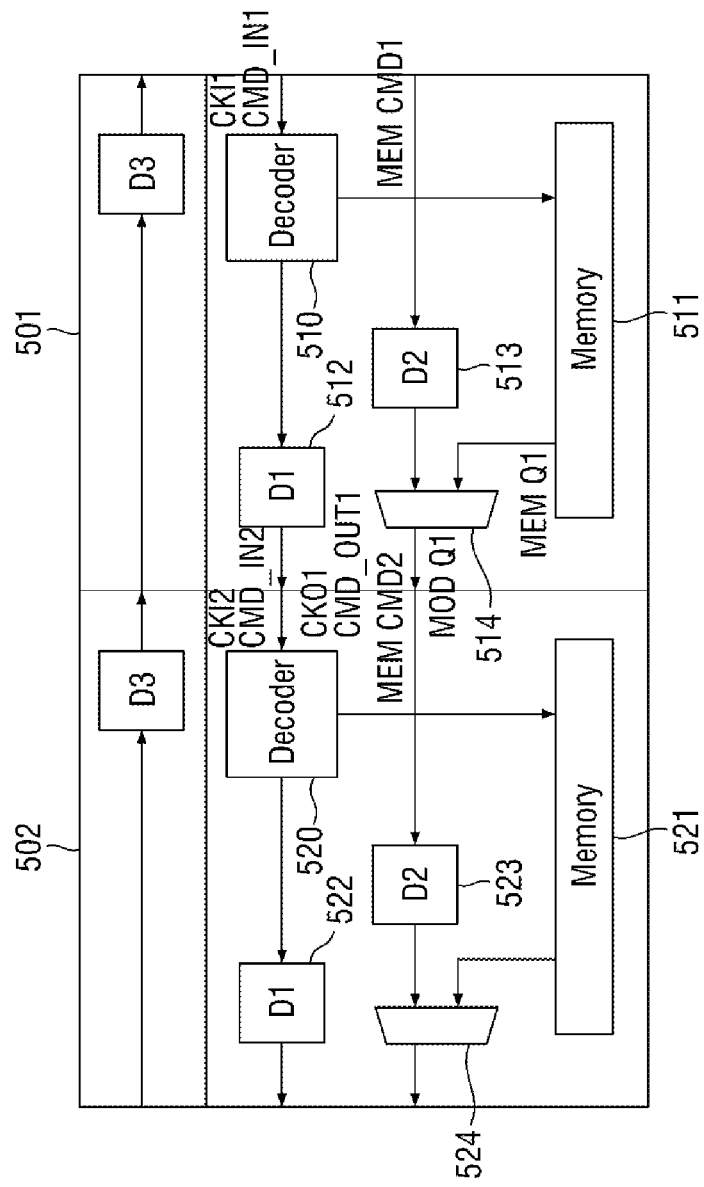
FIG. 10 illustrates a display drive IC according to embodiments of the present disclosure.

FIG. 10 illustrates a display drive IC according to embodiments of the present disclosure. FIG. 11 is a timing diagram illustrating a method of driving the display drive IC of FIG. 10.

Referring to FIG. 10, the display drive IC 100 may include a first memory module 501 and a second memory module 502. The first memory module 501 may be connected to the logic module of the logic region 101 of FIG. 4, and the second memory module 502 may be connected to the first memory module 501.

The first memory module 501 may include a decoder 510, a memory 511, a first latch 512, a second latch 513, and a transmitter 514. The second memory module 502 may include a decoder 520, a memory 521, a first latch 522, a second latch 523, and a transmitter 524.

The decoder 510 may receive a signal including first input clock data CKI1 (i.e., a first input clock signal) and first input command data CMD_IN1. Referring to FIG. 11, first command data CMD1, second command data CMD2, third command data CMD3, and fourth command data CMD4 may be sequentially provided in each clock cycle.

The decoder 510 may transmit first memory command data MEM CMD1 to the memory 511. The first memory command data MEM CMD1 may be transmitted in a clock cycle in which the first input command data CMD_IN1 is transmitted. For example, the first command data CMD1 may be transmitted to the memory 511.

The memory 511 may provide first memory output data MEM Q1 to the transmitter 514. The memory 511 may output first memory output data MEM Q1, based on the first memory command data MEM CMD1 and transmit the first memory output data MEM Q1 in a next clock cycle. For example, first output data Q1 may be output from the memory 511.

The first latch 512 may receive a signal from the decoder 510 and output a signal including first output clock data CK01 and first output command data CMD_OUT1. For example, the second command data CMD2 may be output from the first latch 512.

When the first command data CMD1 is transmitted to the memory 511, the first output command data CMD_OUT1 may sequentially include the second command data CMD2, the third command data CMD3, and the fourth command data CMD4 in each clock cycle.

The transmitter 514 may provide the first memory output data MEM Q1 to the second memory module 502 as first memory module output data MOD Q1. For example, the transmitter 514 may output the first output data Q1 and transmit the first output data Q1 to the second memory module 502.

The signal including the first output clock data CK01 and the first output command data CMD_OUT1 may be transmitted to the second memory module 502, and the decoder 520 may receive a signal including second input clock data CKI2 and second input command data CMD_IN2. The second input command data CMD_IN2 may sequentially include the second command data CMD2, the third command data CMD3, and the fourth command data CMD4 in each clock cycle.

The decoder 520 may receive the signal including the second input clock data CKI2 and the second input command data CMD_IN2. Referring to FIG. 11, the second command data CMD2, the third command data CMD3, and the fourth command data CMD4 may be sequentially provided to the decoder 520 in consecutive clock cycles.

The decoder 520 may transmit second memory command data MEM CMD2 to the memory 521. The second memory command data MEM CMD2 may be transmitted in a clock cycle in which the second input command data CMD_IN2 is transmitted. For example, the decoder 520 may provide the second command data CMD2 to the memory 521.

Figure 11:
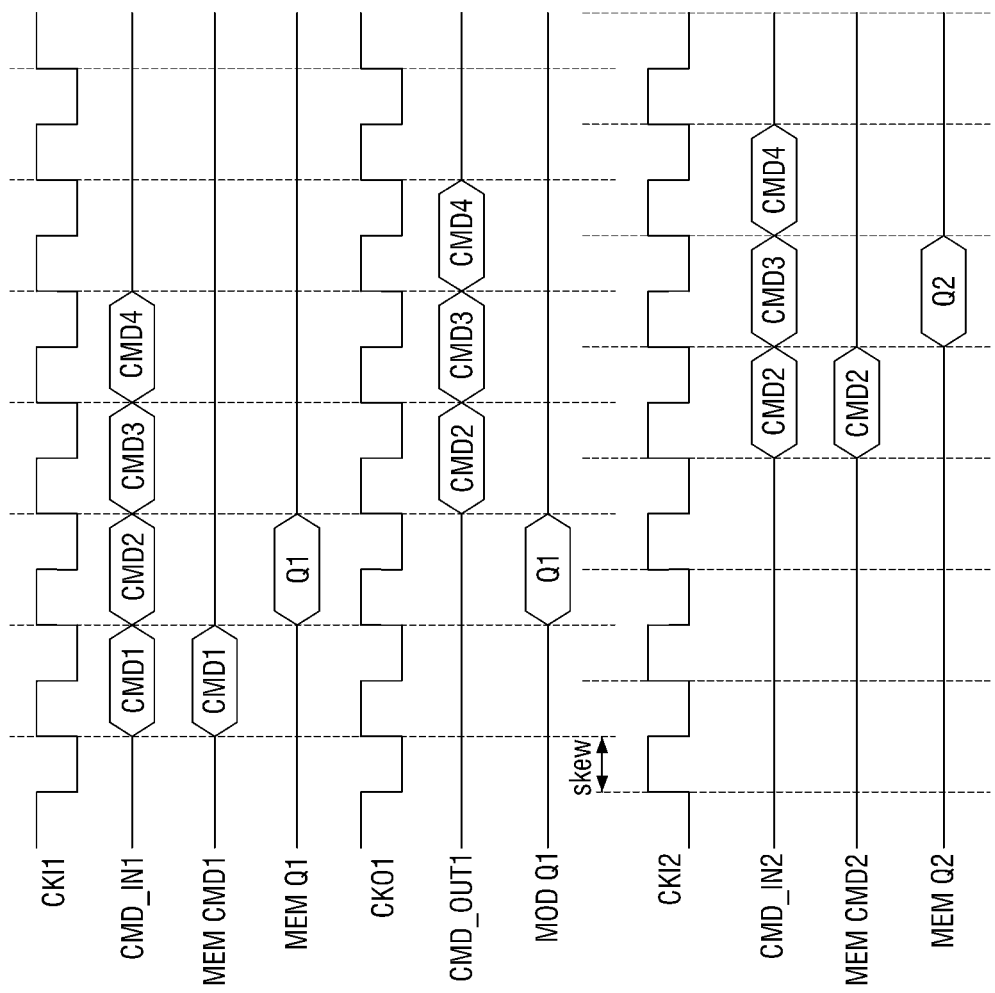
FIG. 11 is a timing diagram illustrating a method of driving the display drive IC of FIG. 10.

Referring to FIG. 11, skew may occur in the first input clock data CKI1 and the second input clock data CKI2. Skew of a clock may occur while a signal is transmitted between the first memory module 501 and the second memory module 502. However, the clock may be synchronized with a reference clock by an element such as a clocked buffer to be described later.

The operation of a display drive IC 500 according to embodiments of the present disclosure when a memory of the display drive IC 500 is read will now be described with reference to FIGS. 12 and 13. Although a case where the memory is read is described, the operation of the memory is not limited to the read operation, and a write operation may also be performed.

Figure 12:
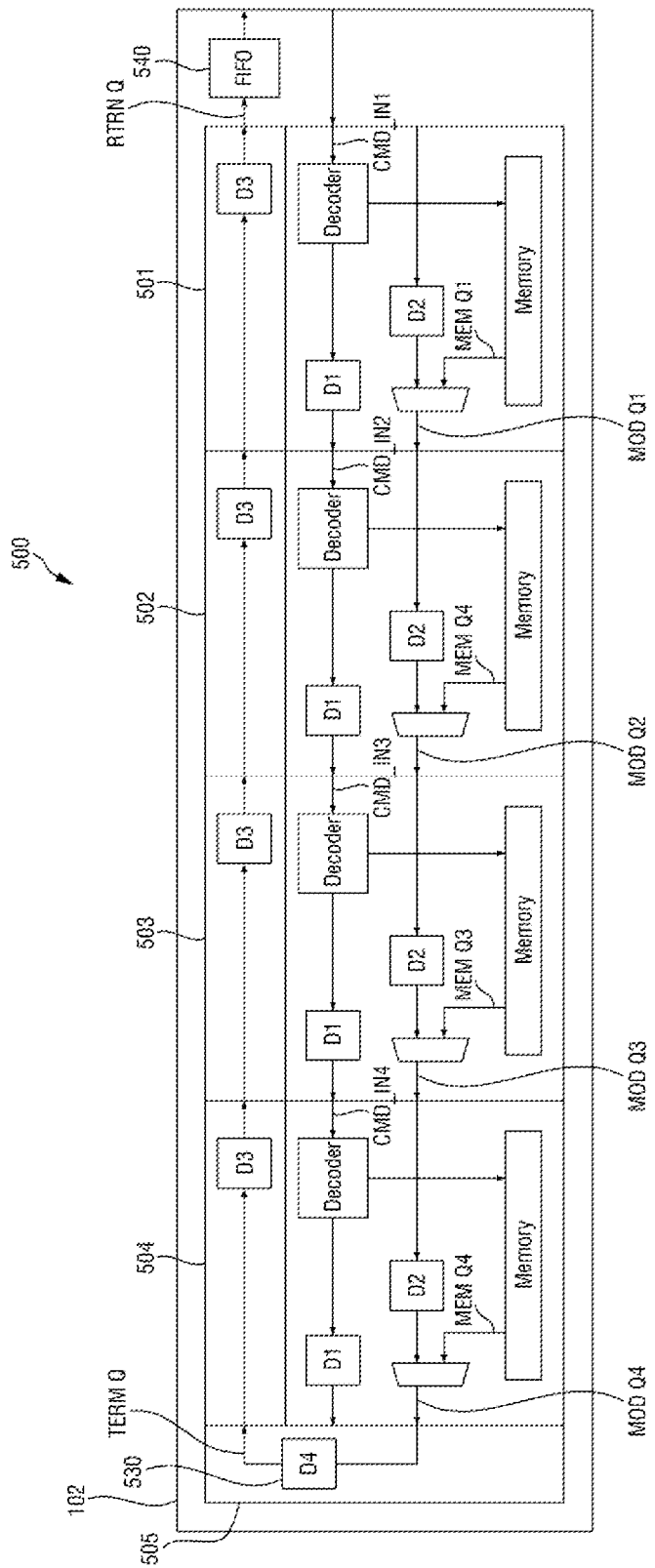
FIG. 12 illustrates a display drive IC according to embodiments of the present disclosure.

FIG. 12 illustrates a display drive IC according to embodiments of the present disclosure. FIG. 13 is a timing diagram illustrating a method of operating the display drive IC of FIG. 12.

Referring to FIG. 12, the display drive IC 500 may include first through fourth memory modules 501 through 504, a termination module 505, and a first-in, first-out (FIFO) module 540 (i.e., a FIFO buffer) in a first region 102.

The first through fourth memory modules 501 through 504 and the termination module 505 may be sequentially connected in series. The FIFO module 540 may be disposed on a side of the first memory module 501 and disposed between a logic module and the first memory module 501. The FIFO module 540 may receive a signal to be transmitted to the logic module from the first memory module 501, process the signal, and then output and provide the processed signal to the logic module.

The first memory module 501 may receive first input command data CMD_IN1 from the logic module and output first memory module output data MOD Q1 to the second memory module 502. The second memory module 502 may receive second input command data CMD_IN2 from the first memory module 501 and output second memory module output data MOD Q2 to the third memory module 503. The third memory module 503 may receive third input command data CMD_IN3 from the second memory module 502 and output third memory module output data MOD Q3 to the fourth memory module 504. The fourth memory module 504 may receive fourth input command data CMD_IN4 from the third memory module 503 and output fourth memory module output data MOD Q4 to the termination module 505.

The termination module 505 may be connected to the fourth memory module 504 which is the last memory module among the memory modules connected in series. The termination module 505 may include a fourth latch 530. The fourth latch 530 may include a D flip-flop, but embodiments according to the technical spirit of the present disclosure are not limited thereto. The fourth latch 530 of the termination module 505 may receive the fourth memory module output data MOD Q4 from the fourth memory module 504 and store the fourth memory module output data MOD Q4. Termination data TERM Q output from the fourth latch 530 may be provided back to the fourth memory module 504.

A signal including the fourth memory module output data MOD Q4 may be delayed by 1 clock cycle by the fourth latch 530 of the termination module 505 and then transmitted. Therefore, even when data is returned to the fourth memory module 504, static timing characteristics may be maintained.

The termination data TERM Q output from the fourth latch 530 may be transmitted sequentially through a latch of the fourth memory module 504, a latch of the third memory module 503, a latch of the second memory module 502 and a latch of the first memory module 501 and then output as return data RTRN Q.

The FIFO module 540 may receive the return data RTRN Q output from the latch of the first memory module 501. While a signal is transmitted through a plurality of memory modules 400, skew between clocks may occur as illustrated in FIG. 11. For example, a clock signal transmitted from the logic module to the first memory module 501 and a clock signal output from the latch of the first memory module 501 may be different from each other in phase. Therefore, a signal including the return data RTRN Q output from the latch of the first memory module 501 may be synchronized with the reference clock by using the FIFO module 540 and then transmitted to the logic module. In an example, the FIFO module 540 may receive the return data RTRN Q from the first memory module 501 and provide the return data RTRN Q to the logic module in response to the reference clock.

Figure 13:
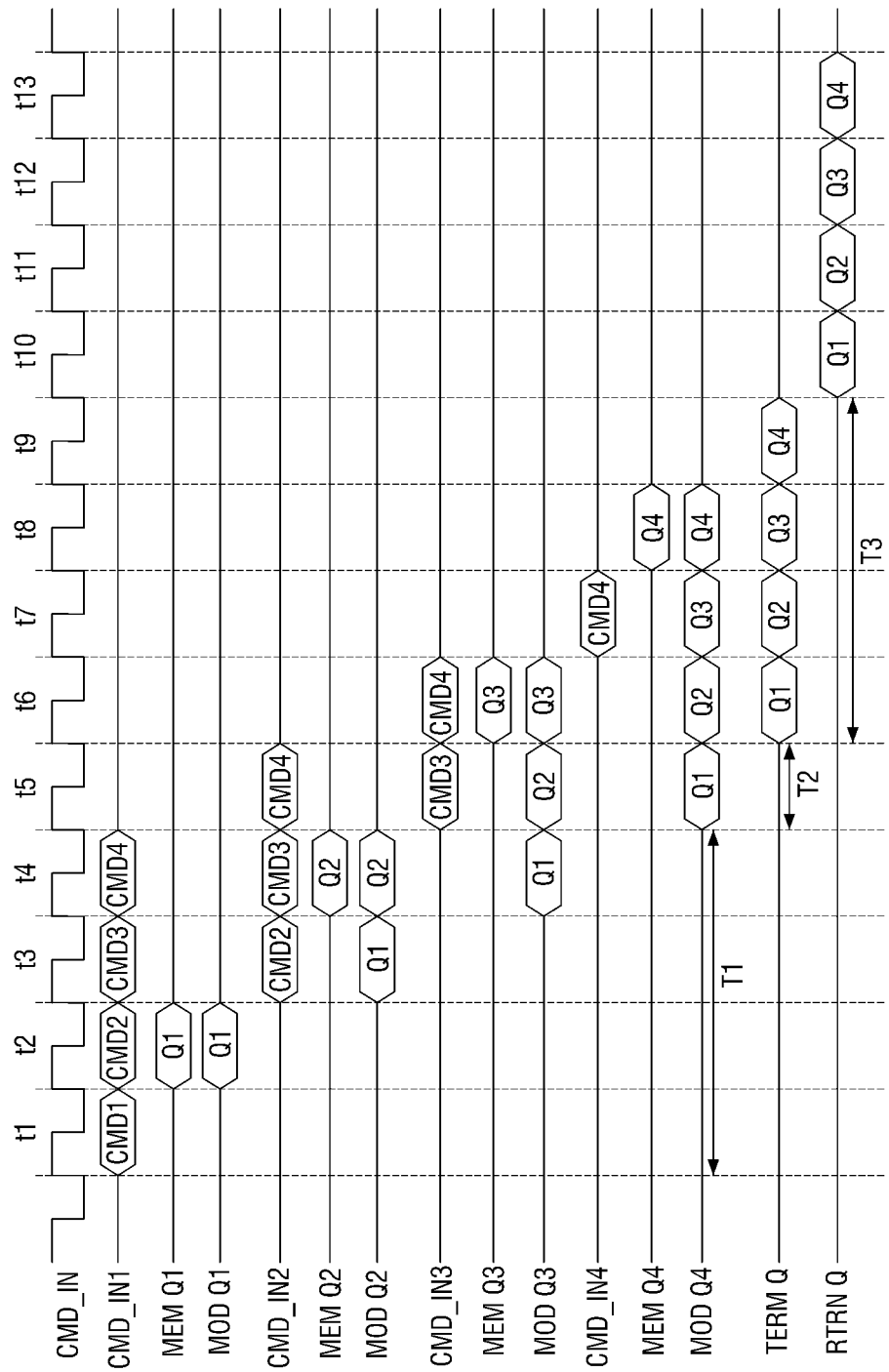
FIG. 13 is a timing diagram illustrating a method of operating the display drive IC of FIG. 12.

FIG. 13 is a timing diagram illustrating the method of operating the display drive IC 500 assuming that clock skew does not occur. However, embodiments according to the technical spirit of the present disclosure are not limited thereto, and clock skew may occur in signal transmission.

Referring to FIG. 13, a clock CK_IN may include first through thirteenth clock cycles t1 through t13.

First input clock data CMD_IN1 may include first command data CMD1, second command data CMD2, third command data CMD3, and fourth command data CMD4 input sequentially.

In the first clock cycle t1, the first command data CMD1 may be input to the first memory module 501. In the second clock cycle t2, the first memory module 501 may output first output data Q1 and transmit the output first output data Q1 to the second memory module 502. In the third clock cycle t3, the second memory module 502 may delay the received first output data Q1 by 1 clock cycle and transmit the delayed first output data Q1 to the third memory module 503. In the fourth clock cycle t4, the third memory module 503 may delay the received first output data Q1 by 1 clock cycle and transmit the delayed first output data Q1 to the fourth memory module 504. In the fifth clock cycle t5, the fourth memory module 504 may delay the received first output data Q1 by 1 clock cycle and transmit the delayed first output data Q1 to the termination module 505. Accordingly, the first command data CMD1 may be input to the first memory module 501, delayed by 4 clock cycles (T1), and then transmitted to the termination module 505.

In the sixth clock cycle t6, the termination module 505 may delay the received first output data Q1 by 1 clock cycle (T2) using the fourth latch 530 and transmit the delayed first output data Q1 to the fourth memory module 504.

In the seventh through tenth clock cycles t7 through t10, the first through fourth memory modules 501 through 504 may delay the received first output data Q1 by 4 clock cycles (T3) and transmit the delayed first output data Q1 to the FIFO module 540.

In the second clock cycle t2, the second command data CMD2 may be input to the first memory module 501. The second command data CMD2 may be delayed by the first memory module 501 and then transmitted to the second memory module 502. In the third clock cycle t3, the second command data CMD2 may be input to the second memory module 502. In the fourth clock cycle t4, the second memory module 502 may output second output data Q2 and transmit the output second output data Q2 to the third memory module 503. In the fifth clock cycle t5, the third memory module 503 may delay the received second output data Q2 by 1 clock cycle and transmit the delayed second output data Q2 to the fourth memory module 504. In the sixth clock cycle t6, the fourth memory module 504 may delay the received second output data Q2 by 1 clock cycle and transmit the delayed second output data Q2 to the termination module 505.

In the seventh clock cycle t7, the termination module 505 may delay the received second output data Q2 by 1 clock cycle using the fourth latch 530 and transmit the delayed second output data Q2 to the fourth memory module 504.

In the eighth through eleventh clock cycles t8 through t11, the first through fourth memory modules 501 through 504 may delay the received second output data Q2 by 4 clock cycles and transmit the delayed second output data Q2 to the FIFO module 540.

In the third clock cycle t3, the third command data CMD3 may be input to the first memory module 501. The third command data CMD3 may be delayed by the first memory module 501 and the second memory module 502 and then transmitted to the third memory module 503. In the fifth clock cycle t5, the third command data CMD3 may be input to the third memory module 503. In the sixth clock cycle t6, the third memory module 503 may output the third output data Q3 and transmit the output third output data Q3 to the fourth memory module 504. In the seventh clock cycle t7, the fourth memory module 504 may delay the received third output data Q3 by 1 clock cycle and transmit the delayed third output data Q3 to the termination module 505.

In the eighth clock cycle t8, the termination module 505 may delay the received third output data Q3 by 1 clock cycle using the fourth latch 530 and transmit the delayed third output data Q3 to the fourth memory module 504.

In the ninth through twelfth clock cycles t9 through t12, the first through fourth memory modules 501 through 504 may delay the received third output data Q3 by 4 clock cycles and transmit the delayed third output data Q3 to the FIFO module 540.

In the fourth clock cycle t4, the fourth command data CMD4 may be input to the first memory module 501. The fourth command data CMD4 may be delayed by the first memory module 501, the second memory module 502 and the third memory module 503 and then transmitted to the fourth memory module 504. In the seventh clock cycle t7, the fourth command data CMD4 may be input to the fourth memory module 504. In the eighth clock cycle t8, the fourth memory module 504 may output the fourth output data Q4 and transmit the output fourth output data Q4 to the termination module 505.

In the ninth clock cycle t9, the termination module 505 may delay the received fourth output data Q4 by 1 clock cycle using the fourth latch 530 and transmit the delayed fourth output data Q4 to the fourth memory module 504.

In the tenth through thirteenth clock cycles t10 through t13, the first through fourth memory modules 501 through 504 may delay the received fourth output data Q4 by 4 clock cycles and transmit the delayed fourth output data Q4 to the FIFO module 540.

The first through fourth output data Q1 through Q4 transmitted to the FIFO module 540 may be synchronized with the reference clock by using the FIFO module 540.

Display drive ICs according to embodiments of the present disclosure will now be described with reference to FIGS. 14 and 15. Hereinafter, differences from the above-described embodiments will be mainly described.

Figure 14:
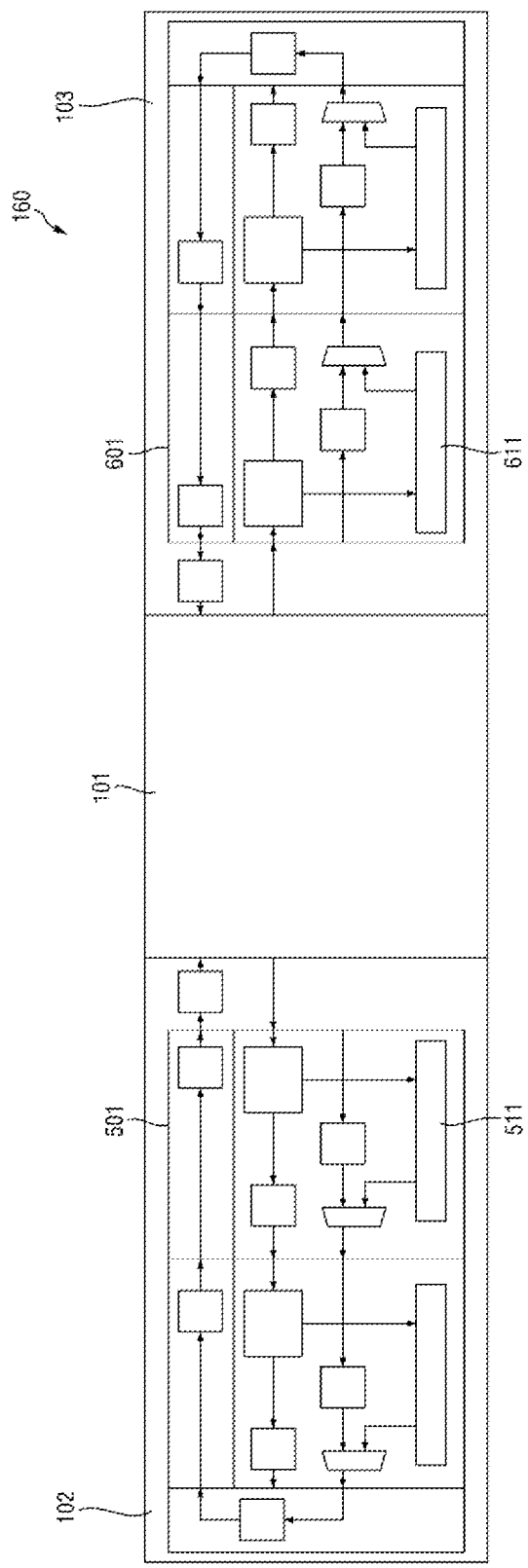
FIGS. 14 and 15 illustrate display drive ICs according to embodiments of the present disclosure.
Figure 15:
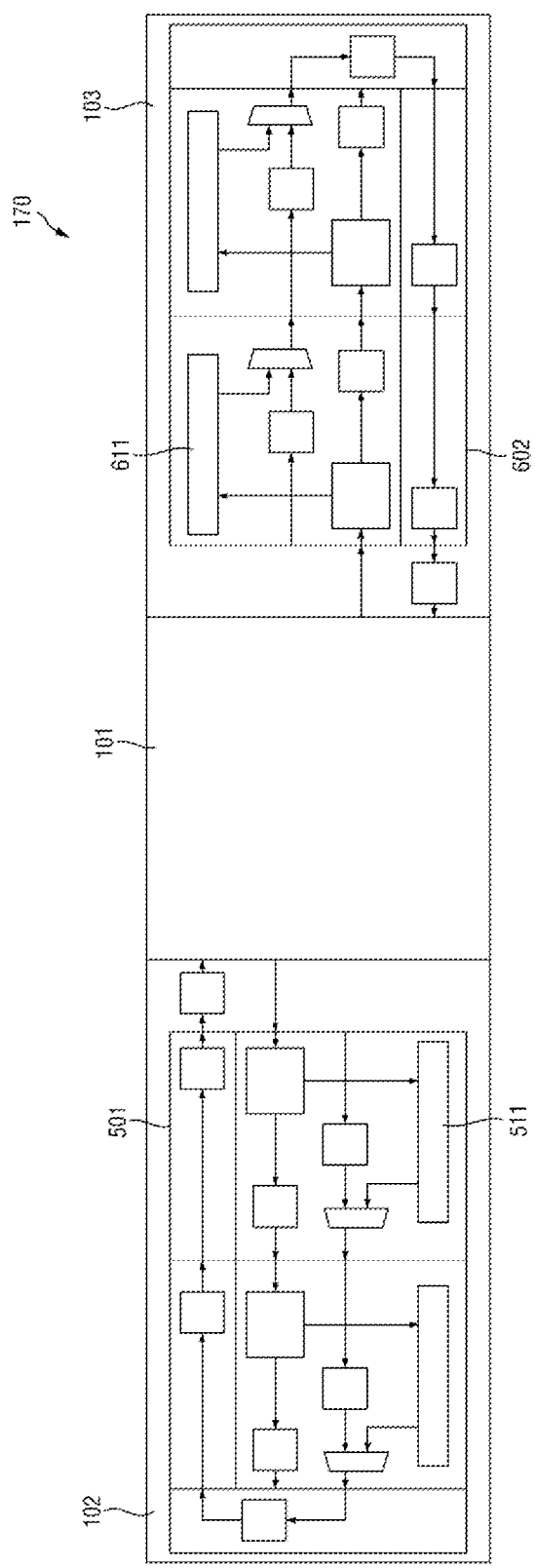

FIGS. 14 and 15 illustrate display drive ICs according to embodiments of the present disclosure.

Referring to FIG. 14, the display drive IC 160 may include a logic region 101, a first region 102, and a second region 103. The first memory module 501 may be disposed in the first region 102, and a memory module 601 may be disposed in the second region 103. The first memory module 501 and the memory module 601 may be disposed symmetrically to each other with respect to the logic region 101. For example, a signal transmitted from the logic region 101 may be provided from the same position to the first memory module 501 and the memory module 601, and signals provided from the first memory module 501 and the memory module 601 to the logic region 101 may be provided to the same position in the logic region 101.

In some embodiments, a memory 511 of the first memory module 501 and a memory 611 of the memory module 601 may be disposed adjacent to lower ends of the first region 102 and the second region 103, respectively.

Referring to FIG. 15, the display drive IC 170 may include a logic region 101, a first region 102, and a second region 103. A first memory module 501 may be disposed in the first region 102, and a memory module 602 may be disposed in the second region 103. The first memory module 501 and the memory module 602 may be rotated 180 degrees to each other with respect to the logic region 101.

In some embodiments, a memory 511 of the first memory module 501 may be disposed adjacent to a lower end of the first region 102, and a memory 611 of the memory module 602 may be disposed adjacent to an upper end of the second region 103.

Figure 16:
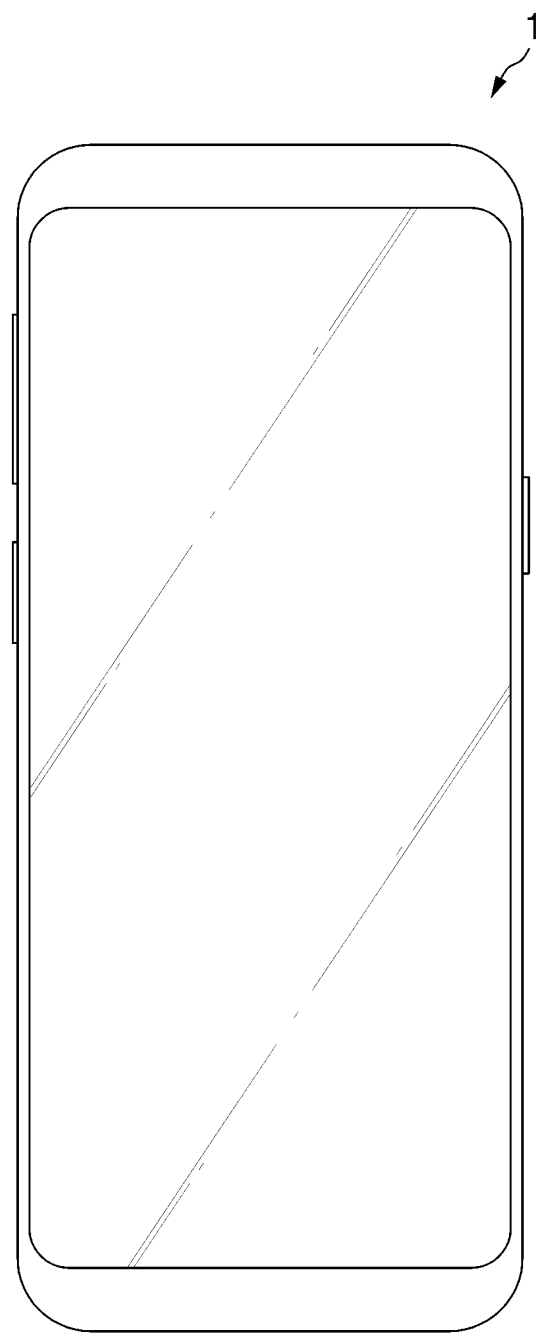
FIGS. 16 and 17 illustrate an electronic device having a display device according to embodiments of the present disclosure.
Figure 17:
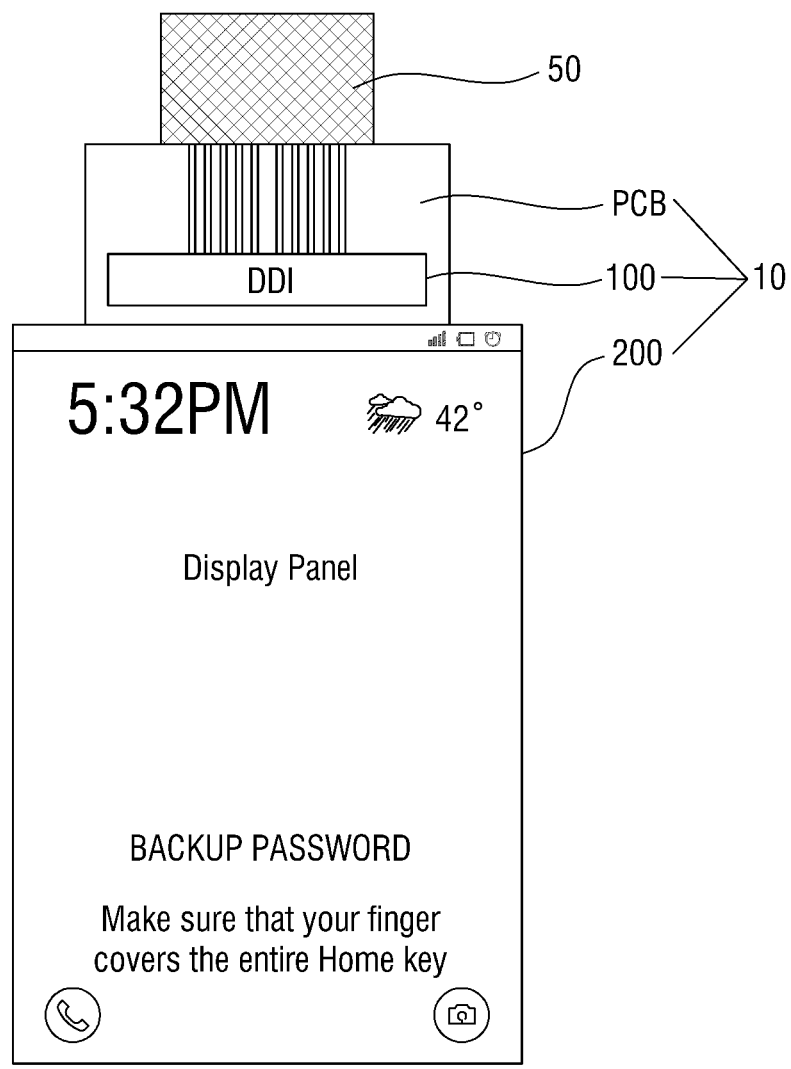

FIGS. 16 and 17 illustrate an electronic device having a display device according to embodiments of the present disclosure.

FIG. 16 illustrates the electronic device 1 having the display device 10. Although a smartphone is illustrated in the drawing, the electronic device 1 may also be a television or a desktop computer as well as a mobile device such as a smartphone, a tablet PC, or a laptop computer.

FIG. 17 illustrates the display device 10 and a processor 50 included in the electronic device 1.

The display device 10 may include a display panel 200, a display drive IC 100, and a printed circuit board substrate PCB. The display panel 200, the display drive IC 100, and the processor 50 may be connected to each other by the printed circuit board substrate PCB.

In some embodiments, when the electronic device 1 is a mobile device, the printed circuit board substrate PCB may include a flexible printed circuit board substrate. The flexible printed circuit board substrate may be folded, and the display drive IC 100 and the processor 50 may be attached to the flexible printed circuit board substrate. As the flexible printed circuit board substrate is folded, the display drive IC 100 and the processor 50 may be located on a back surface of the display panel 200. As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A display driver IC comprising:
   a logic module configured to sequentially issue a plurality of read commands for a first channel, the plurality of read commands including a first read command, a second read command succeeding the first read command, and a third read command succeeding the second read command;
   a plurality of first-channel memory modules connected in series with each other in the first channel and including a first memory module, a second memory module and a third memory module, wherein the first memory module is disposed on a first side of the logic module and connected thereto, and is the closest memory module among the plurality of first-channel memory modules to the logic module; and
   a termination module which is connected to the last memory module among the plurality of first-channel memory modules, the last memory module being the farthest one among the plurality of first-channel memory modules from the logic module,
   wherein the first memory module includes a first decoder, a first memory, a first transmitter, a first downstream latch and a first upstream latch,
   wherein the first decoder is configured to:
   receive the plurality of read commands;
   provide the first read command to the first memory of the first memory module; and
   provide a plurality of first remaining read commands among the plurality of read commands via the first downstream latch to the second memory module which is connected to the first memory module and is farther than the first memory module from the logic module,
   wherein the first memory is configured to output first image data in response to the first read command and provide the first image data to the first transmitter,
   wherein the first transmitter is configured to provide the first image data to the termination module, and
   wherein the first upstream latch of the first memory is configured to receive the first image data from the termination module and provide the first image data to the logic module.

2. The display driver IC of claim 1,
   wherein the second memory module includes a second decoder, a second memory, a second transmitter, a second downstream latch and a second upstream latch, and
   wherein the second decoder of the second memory module is configured to:
   receive the plurality of first remaining read commands from the first memory module;
   send the second read command to the second memory of the second memory module; and
   provide a plurality of second remaining read commands among the plurality of first remaining read commands via the second downstream latch to the third memory module which is connected to the second memory module and is farther than the second memory module from the logic module.

3. The display driver IC of claim 2,
   wherein the second memory is configured to output second image data in response to the second read command and provide the second image data to the second transmitter,
   wherein the second transmitter of the second memory module is configured to sequentially output the first image data received from the first memory module and the second image data received from the second memory module to the termination module, and
   wherein the second upstream latch of the second memory module is configured to sequentially receive the first image data and the second image data from the termination module and sequentially provide the first image data and the second image data to the logic module.

4. The display driver IC of claim 3,
   wherein the third memory module includes a third decoder, a third memory, a third transmitter, a third downstream latch and a third upstream latch,
   wherein the third decoder of the third memory module is configured to:
   receive the plurality of second remaining read commands from the second memory module;
   provide the third read command to a third memory of the third memory module; and
   provide a plurality of third remaining read commands among the plurality of second remaining read commands to a fourth memory module which is connected to the third memory module and is farther than the third memory module from the logic module, and wherein the third memory is configured to output third image data in response to the third read command and provide the third image data to the third transmitter.

5. The display driver IC of claim 4, wherein the third transmitter of the third memory module is configured to sequentially output the first image data received from the second memory module, the second image data received therefrom, and the third image data received from the third memory module to the termination module, and wherein the third upstream latch of the third memory module is configured to sequentially receive the first image data, the second image data, and the third image data from the termination module and sequentially provide the first image data, the second image data and the third image data to the logic module.

6. The display driver IC of claim 1, wherein the first upstream latch includes a D flip-flop.

7. The display driver IC of claim 1, wherein the logic module is configured to further issue a clock signal to the first memory module, wherein the plurality of first-channel memory modules are configured such that the clock signal propagates from the first memory module to the last memory module which is the farthest one among the plurality of first-channel memory modules from the logic module, wherein display driver IC further comprises a first in, first out (FIFO) buffer disposed between the logic module and the first memory module and connected to the first upstream latch of the first memory module, and wherein the FIFO buffer is configured to, in response to a reference clock, receive the first image data and provide the first image data to the logic module.

8. The display driver IC of claim 1, wherein the logic module issues a plurality of read commands for a second channel, wherein the display driver IC further comprises a plurality of second-channel memory modules, wherein a first memory module among the plurality of second-channel memory modules is disposed on a second side of the logic module opposite to the first side and is connected to the second side, and wherein each of the plurality of second-channel memory modules includes a decoder, a memory, a transmitter, a downstream latch, and an upstream latch.

9. The display driver IC of claim 8, wherein the first memory of the first memory module among the plurality of first-channel memory modules is disposed adjacent to a lower end of the first memory module, and a memory of the first memory module among the plurality of second-channel memory modules is disposed adjacent to an upper end of the first memory module among the plurality of second-channel memory modules.

* * * * *